United States Patent
Nelson

(10) Patent No.: US 7,053,736 B2
(45) Date of Patent: May 30, 2006

(54) MICROELECTROMECHANICAL DEVICE HAVING AN ACTIVE OPENING SWITCH

(75) Inventor: Richard D. Nelson, Austin, TX (US)

(73) Assignee: Teravicta Technologies, Inc., Austin, TX (US)

( * ) Notice: Subject to any disclaimer, the term of this patent is extended or adjusted under 35 U.S.C. 154(b) by 325 days.

(21) Appl. No.: 10/260,598

(22) Filed: Sep. 30, 2002

(65) Prior Publication Data

US 2004/0061579 A1 Apr. 1, 2004

(51) Int. Cl.
*H01H 51/22* (2006.01)

(52) U.S. Cl. .................................. 335/70; 200/181
(58) Field of Classification Search ............ 335/78; 200/181

See application file for complete search history.

(56) References Cited

U.S. PATENT DOCUMENTS

| | | | |
|---|---|---|---|
| 6,069,540 A | | 5/2000 | Berenz et al. |
| 6,452,124 B1 | * | 9/2002 | York et al. ............ 200/181 |
| 6,720,851 B1 | * | 4/2004 | Hallbjorner et al. ...... 335/78 |
| 2003/0116417 A1 | * | 6/2003 | DeReus ............... 200/181 |
| 2004/0050674 A1 | * | 3/2004 | Rubel ................. 200/181 |

FOREIGN PATENT DOCUMENTS

EP  0 986 082  3/2000

OTHER PUBLICATIONS

Plötz et al., "A low–voltage torsional actuator for application in RF–microswitches," Sensors and Actuators, vol. A 92, 2001, pp. 312–317.
Hah et al., "A Low Voltage Actuated Micromachined Microwave Switch Using Torsion Springs and Leverage," 2000 IEEE MTT–S Digest, pp. 157–160.
International Search Report, PCT/US03/31239, mailed Oct. 12, 2004.

\* cited by examiner

*Primary Examiner*—Elvin Enad
*Assistant Examiner*—Bernard Rojas
(74) *Attorney, Agent, or Firm*—Kevin J. Daffer; Mollie F. Lettang; Daffer McDaniel LLP

(57) ABSTRACT

A microelectromechanical device is provided which includes a beam configured to apply an opening force on a closed switch. The opening force may be substantially independent of a force stored in the closed switch. A combination of the force applied by the beam and the force stored in the closed switch may be sufficient to open the switch after removal of a force associated with actuation of the switch. Another microelectromechanical device includes a switch beam spaced above a closing gate and a contact structure. The device may also include an additional beam configured to apply a force on the switch beam in a direction away from the contact structure. A method for opening a switch includes reducing an attractive force between a switch beam and a closing gate. The method also includes externally applying a mechanical force on the switch beam in a direction away from the closing gate.

34 Claims, 7 Drawing Sheets

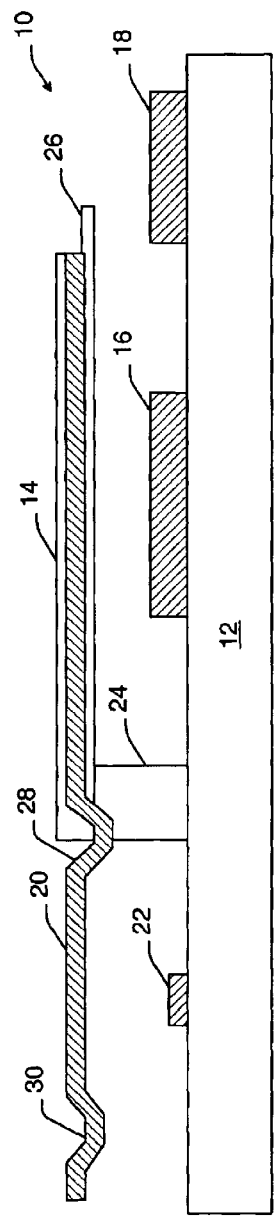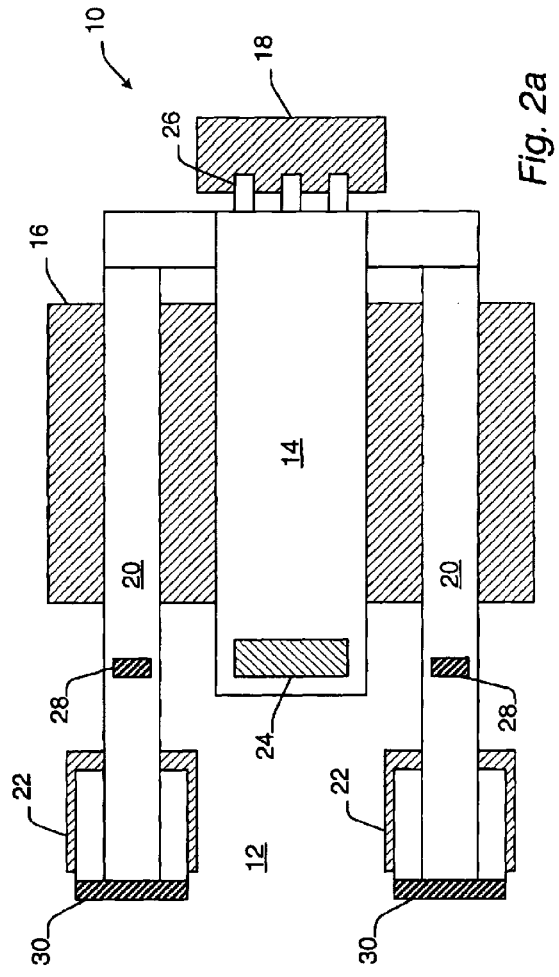

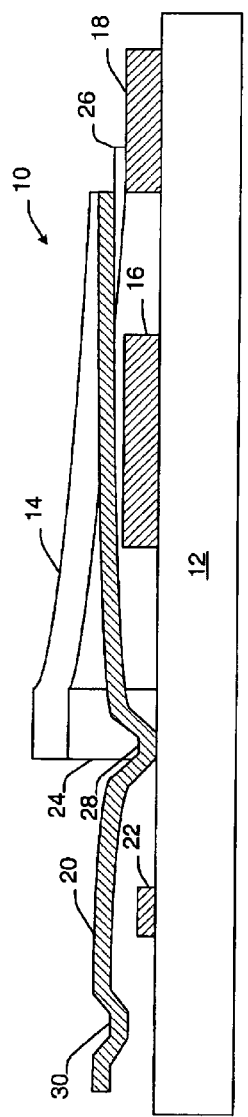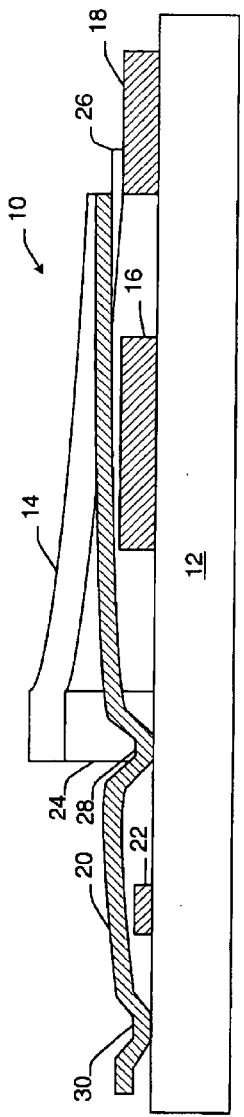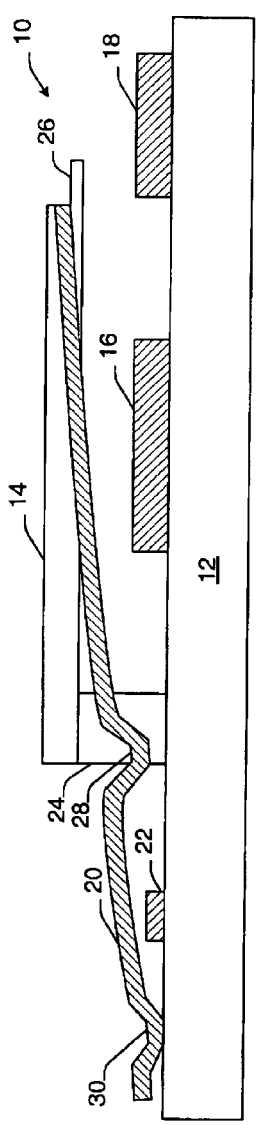

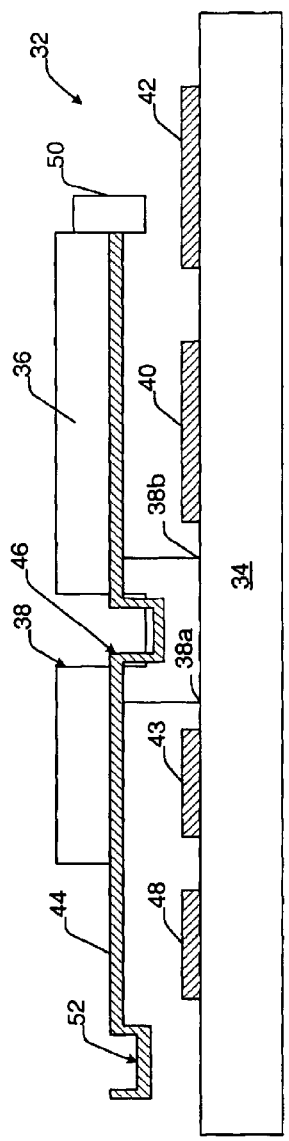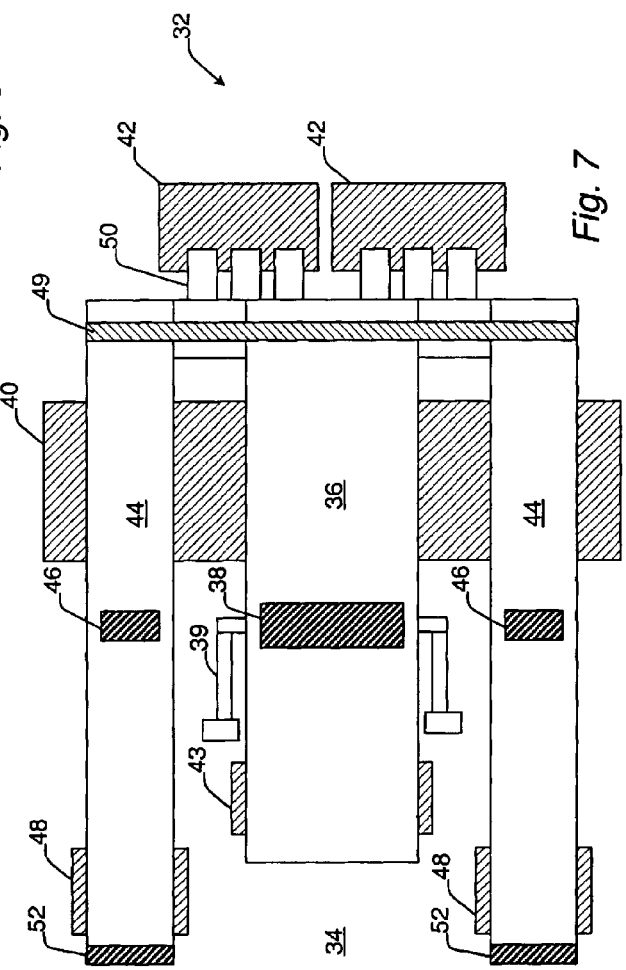

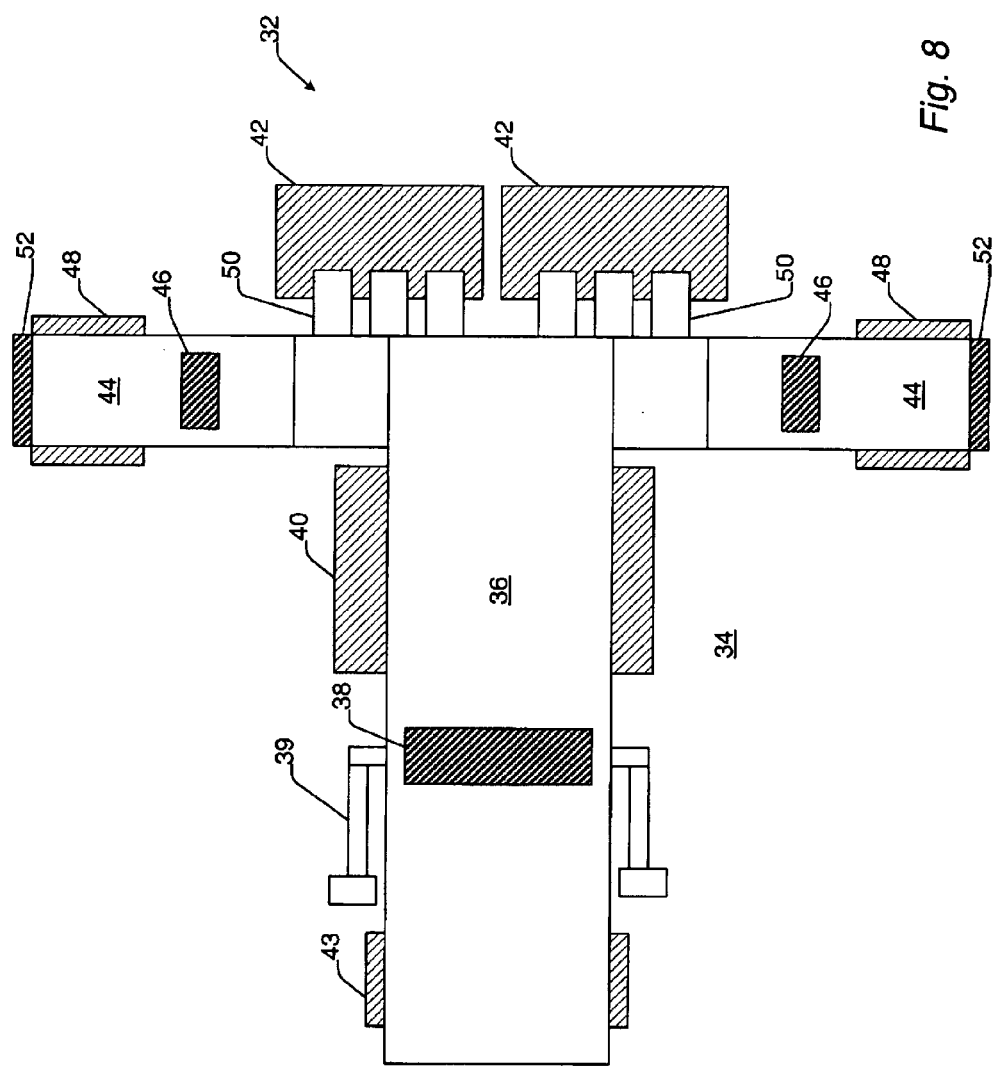

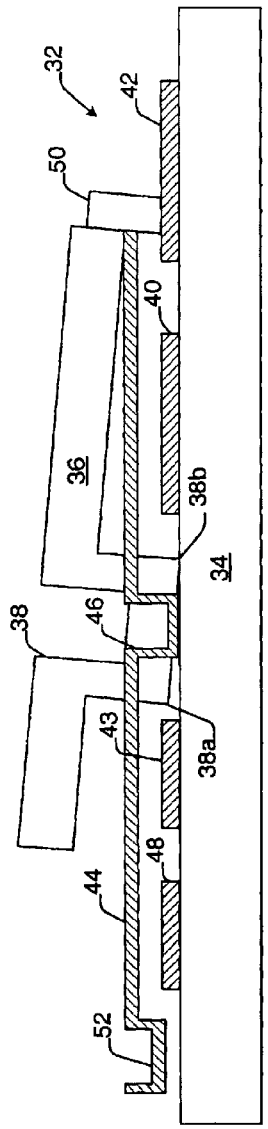
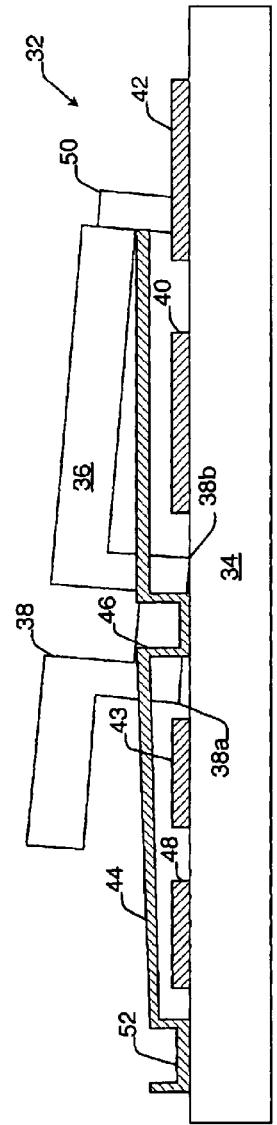
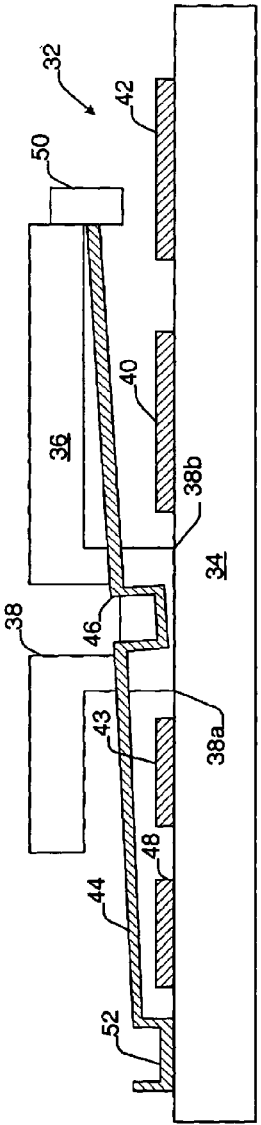

MICROELECTROMECHANICAL DEVICE HAVING AN ACTIVE OPENING SWITCH

BACKGROUND OF THE INVENTION

1. Field of the Invention

This invention relates to microelectromechanical devices, and more particularly, to a microelectromechanical device including a switch configured for active opening by application of a mechanical force.

2. Description of the Related Art

The following descriptions and examples are not admitted to be prior art by virtue of their inclusion within this section.

Microelectromechanical devices, or devices made using microelectromechanical systems (MEMS) technology, are of interest in part because of their potential for allowing integration of high-quality devices with circuits formed using integrated circuit (IC) technology. For example, MEMS switches may exhibit lower losses and a higher ratio of off-impedance to on-impedance as compared to transistor switches formed from conventional IC technology. However, a persistent problem with implementation of MEMS switches has been the high voltage required (often about 40V or higher) to actuate the switches, as compared to typical IC operating voltages (about 5V or lower).

These relatively high actuation voltages of MEMS switches are caused at least in part by a tradeoff between the closing and opening effectiveness of a given switch design. For example, approaches to lowering the actuation voltage of switches have included reducing the stiffness of the switch beam and/or reducing the gap between the beam and the conductive pad. Unfortunately, these design changes typically result in making the switch more difficult to open. MEMS switch designs generally use an applied voltage to close the switch, and rely on the spring force in the beam to open the switch when the applied voltage is removed. In opening the switch, the spring force or restoring force of the beam must typically counteract what is often called "stiction." Stiction refers to various forces tending to make two surfaces stick together such as van der Waals forces, surface tension caused by moisture between the surfaces, and/or bonding between the surfaces (e.g., through metallic diffusion). In general, modifications to a switch which act to lower the closing voltage also tend to make the switch harder to open, such that efforts to form a switch with a lowered closing voltage can result in a switch which may not open reliably (or at all).

Electrostatically actuated MEMS switches, both cantilevers and straps, generally can not be forced to open simply by changing the polarity of voltage on the gate. This inability to open is also due to the nature of electrostatic attraction. Therefore, the switch must be designed so that the elastic energy stored in the deformed switch is sufficient to cause opening after the actuating voltage is removed. Push-pull operation can be achieved if a second electrode is provided above the beam, but this is complex. Another alternative is a double gate structure, which has active opening ability. Magnetically actuated structures can be made with active opening, but such structures generally require more complex material sets and higher actuation currents. Teeter-totter designs also have active opening properties because when one half of the beam is in contact the other half can be actuated to cause opening.

Teeter-totter designs, however, are not as simple as cantilevers due to the pivot structure, which must be robust. In addition, since the clearance at the closed side is smaller than that at the open side, opening requires a larger voltage. For instance, if a closed dimple-less teeter-totter has an average clearance over the gate of the closed side of 1 micron, the average clearance over the gate of the open side is 2 microns. The voltage applied to the closing side creates a certain contact force at the contact. The same voltage applied to the opening side will create only ¼ the opening force. If the switch contact tends to stick with a sticking force comparable to the actuating force, twice the voltage must be applied to the opening side to break contact. However, it may be desirable to have several times greater opening force than closing force, implying even larger voltage differences. Currently, these problems are addressed by making the gate and beam on the opening side larger than that on the closing side. Other solutions are to add dimples to the contact, which limit the angular travel of the switch and make the opening side gap at the gate similar to that on the closing side.

It would therefore be desirable to develop a MEMS device which relaxes the constraints imposed by the above-described tradeoff between opening and closing effectiveness.

SUMMARY OF THE INVENTION

The problems outlined above may be in large part addressed by a microelectromechanical device that includes an additional beam configured to apply an opening force on a closed switch. The opening force may be substantially independent of a force stored in the closed switch. The opening force may be a mechanical force. In some embodiments, the additional beam may be configured to apply the opening force on the closed switch upon actuation of the additional beam by an electrostatic force. In one embodiment, a combination of the force applied by the additional beam and a force stored in the closed switch may be sufficient to open the switch after removal of a force associated with actuation of the switch. In other embodiments, a combination of the force applied by the additional beam and a force stored in the closed switch may be sufficient to overcome a sticking force tending to keep the switch closed after removal of a force associated with actuation of the switch. The device may be further configured as described herein.

Another embodiment relates to a microelectromechanical device that includes a switch beam spaced above a closing gate and a contact structure. Actuation of the closing gate may bring a portion of the switch beam into contact with the contact structure. The device may also include an additional beam configured to apply a force on the switch beam in a direction away from the contact structure. The additional beam may also be configured to apply the force on the switch beam upon actuation of an opening gate proximate to an end of the additional beam spaced from the contact structure. In addition, the device may include at least one other additional beam configured to apply an additional force on the switch beam in the direction away from the contact structure.

In one embodiment, the switch beam may be a cantilever beam. The force applied by the additional beam may be independent of an inherent opening force of the switch beam due to deformation. A combination of the force applied by the additional beam and a force stored in the switch beam may be sufficient to move the switch beam away from the contact structure upon reduction of an attractive force between the switch beam and the closing gate. In another embodiment, the switch beam may be a teeter-totter beam. In such an embodiment, a combination of the force applied by the additional beam and a force stored in pivot springs of the switch beam may be sufficient to move the switch beam away from the contact structure upon reduction of an attractive force between the switch beam and the closing gate.

The additional beam may extend from the switch beam away from the contact structure and toward an opening gate. In some embodiments, the additional beam may extend from the switch beam away from the contact structure in a direction approximately parallel to a length of the switch beam. In other embodiments, the additional beam may extend from the switch beam away from the contact structure in a direction substantially perpendicular to a length of the switch beam. In yet other embodiments, the additional beam may extend from the switch beam away from the contact structure and may be collinear with the switch beam.

The additional beam may have a first end proximate the contact structure and a second end proximate an opening gate. The additional beam may also have an additional fulcrum disposed between the first and second ends. In some embodiments, the switch beam may include a main fulcrum spaced from the contact structure. The main fulcrum of the switch beam and the additional fulcrum of the additional beam may have lower surfaces that are not coplanar. In other embodiments, the main fulcrum of the switch beam may have a height greater than a height of the additional fulcrum of the additional beam. In some embodiments, a thickness of the additional beam may be different than a thickness of the switch beam.

Actuation of the closing gate may bring a portion of the additional beam toward the contact structure. In some embodiments, actuation of the closing gate may increase a force with which the switch beam contacts the contact structure. In one embodiment, actuation of the closing gate may bring an additional fulcrum of the additional beam into contact with an upper surface of a substrate upon which the closing gate and the contact structure are formed. An opening gate may be formed below the additional beam. In addition, actuation of the closing gate may bring the additional beam toward the opening gate. Furthermore, the additional beam may be configured to bend upon actuation of the opening gate such that a portion of the additional beam spaced from the switch beam may contact a substrate upon which the opening gate is formed. In some embodiments, the additional beam may include a dimpled portion proximate the opening gate such that the additional beam does not contact the opening gate upon actuation of the opening gate. The device may be further configured as described herein.

Another embodiment relates to a method for opening a switch. The method may include reducing an attractive force between a switch beam and a closing gate. The method may also include externally applying a mechanical force on the switch beam in a direction away from the closing gate. In some embodiments, reduction of the attractive force and application of the mechanical force may be performed substantially simultaneously. In alternative embodiments, reducing the attractive force may be performed before or after applying the mechanical force.

BRIEF DESCRIPTION OF THE DRAWINGS

Other objects and advantages of the invention will become apparent upon reading the following detailed description and upon reference to the accompanying drawings in which:

FIG. 1 depicts a partial side view of an embodiment of a microelectromechanical device that includes an additional beam configured to apply a force on a switch beam in a direction away from a contact structure;

FIG. 2a depicts a top view of the microelectromechanical device of FIG. 1;

FIG. 3 depicts a partial side view of the microelectromechanical device of FIG. 1 with a portion of the switch beam in contact with the contact structure by actuation of a closing gate;

FIG. 4 depicts a partial side view of the microelectromechanical device of FIG. 1 with a portion of the additional beam in contact with the substrate by actuation of an opening gate;

FIG. 5 depicts a partial side view of the microelectromechanical device of FIG. 1, in which the switch beam is moved away from the contact structure upon removal of a force associated with actuation of the closing gate;

FIG. 6 depicts a partial side view of an additional embodiment of a microelectromechanical device that includes an additional beam configured to apply a force on a switch beam in a direction away from a contact structure;

FIG. 7 depicts a top view of the microelectromechanical device of FIG. 6;

FIGS. 8 and 9 depict top views of additional embodiments of a microelectromechanical device that includes an additional beam configured to apply a force on a switch beam in a direction away from a contact structure;

FIG. 11 depicts a partial side view of the microelectromechanical device of FIG. 6 with a portion of the switch beam in contact with the contact structure by actuation of a closing gate;

FIG. 12 depicts a partial side view of the microelectromechanical device of FIG. 6 with a portion of the additional beam in contact with the substrate by actuation of an opening gate; and FIG. 13 depicts a partial side view of the microelectromechanical device of FIG. 6, in which the switch beam is moved away from the contact structure upon removal of a force associated with actuation of the closing gate.

Figure 2B:
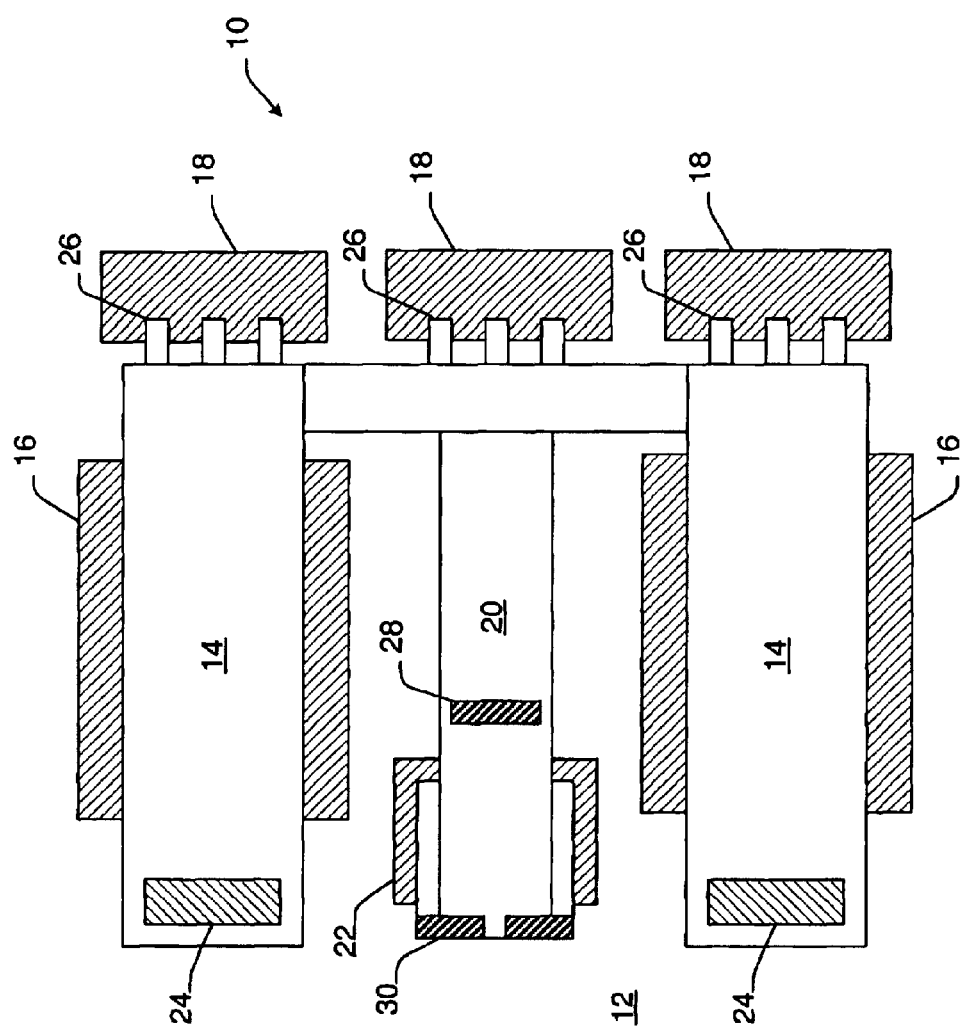
FIG. 2b depicts a top view of another embodiment of a microelectromechanical device that includes an additional beam configured to apply a force on more than one switch beam in a direction away from contact structures.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, FIGS. 1–13 illustrate exemplary embodiments of microelectromechanical devices that include switches configured for active opening by application of a mechanical force. It is noted that FIGS. 1–13 are not drawn to scale. In particular, the vertical scale of FIGS. 1 and 3–5, as well as of FIGS. 6 and 10–13, is greatly exaggerated to emphasize the components of the devices. In general, the lateral dimensions of such devices may be on the order of tens to hundreds of microns while the vertical dimensions may be on the order of one to several microns. It is also noted that FIGS. 1–13 are not drawn to the same scale.

In the embodiment of FIGS. 1–5, MEMS device 10 is arranged upon substrate 12. In an embodiment in which substrate 12 is incorporated into an integrated circuit, substrate 12 may be, for example, a silicon, ceramic, or gallium arsenide substrate. Alternatively, substrate 12 may be glass, polyimide, metal, or any other substrate material commonly used in the fabrication of microelectromechanical devices. For example, substrate 12 may be a monocrystalline silicon substrate or an epitaxial silicon layer grown on a monocrystalline silicon substrate. In addition, substrate 12 may include a silicon on insulator (SiO) layer, which may be formed upon a silicon wafer.

MEMS device 10 includes switch beam 14 spaced above closing gate 16 and contact structure 18. For example, switch beam 14 may be spaced above closing gate 16 and contact structure 18 by support structure 24 as described herein. Closing gate 16 and contact structure 18 may be formed on an upper surface of substrate 12. MEMS device 10 may also include more than one closing gate and more than one contact structure spaced below switch beam 14. In another embodiment, MEMS device 10 may include insulating structures (not shown) arranged between closing gate 16 and contact structure 18. Switch beam 14, closing gate 16, and contact structure 18 form at least a portion of a switch. In an embodiment, MEMS device 10 also includes additional beam 20 coupled to the switch. Additional beam 20 is spaced above closing gate 16, opening gate 22, and optionally contact structure 18. Opening gate 22 may be formed on an upper surface of substrate 12. In addition, more than one opening gate may be formed on the upper surface of the substrate and spaced below additional beam 20. Furthermore, MEMS device 10 may include at least one other additional beam 20 coupled to the switch, as shown in FIG. 2a. The other additional beam may be configured as described herein. In addition, the two additional beams may be similarly configured or may be configured differently. In other embodiments, the MEMS device may include more than two additional beams.

Additional beam 20 extends from switch beam 14 proximate the contact structure. For example, additional beam 20 may be coupled to switch beam 14. In one embodiment, additional beam 20 and switch beam 14 may be formed from a single, continuous material. In this embodiment, additional beam 20 and switch beam 14 may be formed simultaneously using one or more fabrication steps. In alternative embodiments, the additional beam and the switch beam may be formed of different materials. In such embodiments, the additional beam and the switch beam may be formed in different fabrication steps. The additional beam and the switch beam may then be attached to each other, for example, by bonding. Alternatively, the beams may be separate, but may be coupled by another means. For example, portions of the two beams proximate the contact structure may overlap such that the two beams may come into contact with one another. In one such example, switch beam 14 may overlap additional beam 20 such that additional beam 20 contacts a lower surface of the switch beam (i.e., a surface of the switch beam closest to the contact structure). In this manner, the additional beam may apply a mechanical force on the lower surface of the switch beam in a direction away from the contact structure as described herein. In addition, each additional beam may be configured to apply a force on the switch beam in a direction away from the contact structure. Furthermore, the switch beam and the additional beam may be coupled in any other manner known in the art provided that additional beam 20 may apply a force to switch beam 14 as described herein.

If switch beam 14 is a cantilever as shown in FIGS. 1–5, the additional beam may be coupled to the free end of the cantilever beam. The free end of the additional beam may be disposed proximate the opening gate. For example, additional beam 20 may extend from switch beam 14 away from contact structure 18 and toward opening gate 22. In addition, the additional beam may extend from the free end of the cantilever beam toward the fixed end of the cantilever beam. The additional beam may or may not extend beyond the fixed end of the cantilever beam. For example, additional beam 20 may extend in a direction approximately parallel to a length of the switch beam, as shown in FIG. 2a. Alternatively, the additional beam may extend from the free end of the cantilever beam away from its fixed end. For example, additional beam 20 may extend in a direction at an angle to the length of switch beam 14. In one embodiment, additional beam 20 may extend in a direction substantially perpendicular to a length, or the axial direction, of the beam as described herein. In another alternative embodiment, additional beam 20 may be collinear with switch beam 14 as described herein.

Closing gate 16 and opening gate 22 may include a conductive material, such as polysilicon or metal. In particular, gates 16 and 22 may include gold, copper, titanium, tungsten, or alloys of such metals. In one embodiment, gates 16 and 22 may include the same materials. In another embodiment, gates 16 and 22 may include different materials. Gates 16 and 22 are preferably arranged under switch beam 14 and/or additional beam 20 such that the lengths of gates 16 and 22 are perpendicular to the length of switch beam 14 and additional beam 20. Closing gate 16 may extend beyond the periphery of switch beam 14 and additional beams 20, as shown in FIG. 2a. Alternatively, a length of closing gate 16 may be approximately equal to the combined width of switch beam 14, additional beams 20, and a spacing between each of the additional beams and switch beam 14 such that the closing gate resides entirely under the switch beam and the additional beams. In another alternative, a length of closing gate 16 may be approximately equal to the width of switch beam 14. In a further embodiment, the closing gate may extend beyond the periphery of the switch beam but not under the additional beams. In some embodiments, closing gate 16 may include separate gate electrodes. Each separate gate electrode may be spaced below the switch beam or one of the additional beams.

An opening gate may be spaced below each of the additional beams 20, as shown in FIG. 2a. Opening gate 22 may extend beyond the periphery of additional beam 20 below which it is spaced, as shown in FIG. 2a. Alternatively, the lengths of the opening gates may be approximately equal to the widths of the additional beams. In another alternative, one opening gate may be spaced below both of the additional beams. In this embodiment, the one opening gate may have a length equal to or greater than the combined width of the additional beams and a spacing between the additional beams. In addition, as shown in FIG. 2a, the lengths of gates 16 and 22 may be substantially different. For example, closing gate 16 may have a length greater than a length of opening gate 22. Furthermore, as shown in FIG. 2a, the widths of gates 16 and 22 may be substantially different. In particular, closing gate 16 may be wider than opening gate 22. In addition, an upper surface of closing gate 16 and opening gate 22 may or may not be coplanar.

Contact structure 18 may include a conductive material such as gold, copper, titanium, tungsten, or an alloy of such metals. As such, contact structure 18 may include the same material as gates 16 and/or 22. Such an embodiment may be particularly advantageous because contact structure 18 and gates 16 and/or 22 may be formed simultaneously during the fabrication of MEMS device 10. Alternatively, contact structure 18 may include a different material than gates 16 and/or 22. In embodiments in which contact structure 18 includes a conductive material, contact structure 18 may serve as a conductive pad such as a drain pad. In this manner, contact structure 18 may allow a signal to pass to and/or from switch beam 14 when switch beam 14 is in contact with contact structure 18. In some embodiments, contact structure 18 may include a non-conductive material such as silicon dioxide ($SiO_2$), silicon nitride ($Si_xN_y$), silicon oxynitride ($SiO_xN_y(H_z)$), or silicon dioxide/silicon nitride/silicon dioxide (ONO). For example, contact structure 18 may include a dielectric cap layer arranged upon the conductive material. Such a dielectric cap layer may allow for capacitive coupling at contact structure 18.

At least a portion of contact structure 18 may be arranged under switch beam 14, and the contact structure may extend under the switch beam such that a length of the contact structure is perpendicular to the length of switch beam 14. In addition, contact structure 18 may be arranged under switch beam 14 and one or more additional beams 20. As such, contact structure 18 may extend beyond the periphery of switch beam 14. Alternatively, contact structure 18 may reside entirely under the periphery of switch beam 14. In some cases, contact structure 18 may include a single structure, as shown in FIG. 2*a*. In other embodiments, contact structure 18 may include multiple sections spaced laterally from each other along the width of switch beam 14. In such an embodiment, the multiple sections may include the same or different materials. In other embodiments, the multiple sections may have the same or different dimensions. Furthermore, the upper surface of contact structure 18 may be above or below the upper surfaces of gates 16 and 22. Alternatively, contact structure 18 may be approximately the same height as gates 16 and 22.

As stated above, switch beam 14 is preferably spaced above closing gate 16 and contact structure 18. For example, switch beam 14 may be supported by one or more support structures arranged at either or both of the respective ends of the beam. In particular, switch beam 14 may be supported by support structure 24 as shown in FIGS. 1–5. As such, switch beam 14 may be a cantilever beam. Support structure 24 may include similar materials to those used for switch beam 14, contact structure 18, and/or gates 16 and 22. As such, the support structure may include conductive or non-conductive materials. In an embodiment in which support structure 24 is conductive, support structure 24 may serve as a conductive pad. In some cases, support structure 24 may include the same material as included in contact structure 18 and/or gates 16 and 22. Alternatively, support structure 24 may include a different material than included in contact structure 18 and/or gates 16 and 22. In addition, support structure 24 may be substantially the same height as contact structure 18 and/or gates 16 and 22. Alternatively, support structure 24 may be substantially higher or lower than contact structure 18 and/or gates 16 and 22, as shown in FIGS. 1 and 3–5. In yet another embodiment, support structure 24 may be omitted from the structure of MEMS device 10. In such an embodiment, switch beam 14 may extend down to substrate 12 at respective ends of the switch beam such that switch beam 14 may support itself.

Switch beam 14 and additional beam 20 may include a variety of materials. For example, switch beam 14 and additional beam 20 may include a dielectric material and/or a conductive material such as gold, copper, titanium, tungsten, or an alloy of such metals. In some cases, switch beam 14 and additional beam 20 may include the same material as included in contact structure 18 and/or gates 16 and 22. Alternatively, switch beam 14 and additional beam 20 may include a different material than included in contact structure 18 and/or gates 16 and 22. In addition, switch beam 14 and additional beam 20 may be formed of the same materials or different materials. Furthermore, switch beam 14 and additional beam 20 may have different thicknesses. In addition, a stiffness of switch beam 14 may be different than a stiffness of additional beam 20. Preferably, switch beam 14 includes a material that may adequately bend in response to the introduction of an actuation force such as an electrostatic or other force between closing gate 16 and the switch beam. In addition, additional beam 20 includes a material that may adequately bend in response to the introduction of an actuation force such as an electrostatic or other force between opening gate 22 and the additional beam. Alternatively, switch beam 14 and additional beam 20 may bend due to residual stresses contained within the beams. In other embodiments, switch beam 14 and additional beam 20 may bend due to piezoelectric or thermal deformations of the beam itself. In an embodiment in which an electrostatic force is applied, a relatively flexible material advantageously allows the device to be actuated at a relatively low voltage.

In addition or alternatively, switch beam 14 may include one or more recessed portions. For example, switch beam 14 may include a recessed portion (not shown), sometimes called a "dimple" or extended portion 26, sometimes called a "finger," above contact structure 18, as shown in FIG. 1, such that the recessed or extended portion may contact the contact structure upon actuation of the switch. In some embodiments, switch beam 14 may include multiple recessed portions or multiple extended portions 26 over contact structure 18, as shown in FIG. 2*a*. In alternative embodiments, switch beam 14 may not include any recessed portions or extended portions. In addition or alternatively, contact structure 18 may have one or more raised sections arranged on its upper surface (not shown). The raised sections may include flat, pointed, rounded, or square bumps. Such raised sections and/or recessed or extended portions of the beam may help localize contact between switch beam 14 and contact structure 18 while preventing contact between the closing gate and the switch beam. In addition, the raised and recessed or extended portions may help break through contamination that may reside upon the contact interface between contact structure 18 and the overlying portion of switch beam 14. Additional beam 20 may also include such recessed or extended portions proximate the contact structure.

In general, MEMS device 10 may be adapted to pass a signal. Such a signal may be, for example, an electrical, acoustical, thermal, or optical signal. Regardless of the type of signal, the device may be adapted to pass the signal between switch beam 14 and contact structure 18. As such, in an embodiment in which switch beam 14 may be brought into contact with contact structure 18 such as illustrated and described in FIGS. 3 and 4 below, the signal path may continue to one or more segments of contact structure 18. In this manner, MEMS device 10 may be adapted to pass the signal from switch beam 14 to contact structure 18 and/or from contact structure 18 to switch beam 14. Moreover, switch beam 14, in such an embodiment, may bridge a connection between two drain regions of a circuit such that a signal may pass through them. Such a signal path may or may not pass through support structure 24.

In an embodiment in which a signal may pass from one end of the switch beam to another, switch beam 14 may include a continuous layer of conductive material extending from a first end to a second end of the switch beam. In particular, switch beam 14 may include a continuous layer of conductive material extending along the entire length of the switch beam. Such a switch beam may, in some embodiments, include layers of dielectric material above or below such a layer of conductive material. Alternatively, approximately the entire switch beam 14 may include conductive material (i.e., a single layer of conductive material or multiple layers of conductive material). In addition, MEMS device 10 may be adapted to pass a signal from a first end of switch beam 14 to a second end of switch beam 14 and to contact structure 18. In such an embodiment, contact structure 18 preferably includes a conductive material without a dielectric capping layer thereon.

In some cases, switch beam 14 may include an insulating element interposed between conductive portions of the switch beam (not shown). In particular, such an insulating element may be arranged over contact structure 18 and in some embodiments, centered over contact structure 18. In some embodiments, the width of the insulating element may be smaller than the width of contact structure 18. As such, the conductive portions of switch beam 14 on either side of the insulating element may be in contact with contact structure 18 when switch beam 14 is brought into contact with the contact structure. Consequently, MEMS device 10 may be adapted to pass a signal between one end of switch beam 14 and contact structure 18. In this manner, the device may be adapted to close a circuit or short switch beam 14 to ground at contact structure 18. Moreover, switch beam 14, in such an embodiment, may bridge a connection between two drain regions of a circuit such that a signal may pass through them. In some cases, the insulating element may be axially arranged within switch beam 14. More specifically, the insulating element may be interposed between conductive portions of switch beam 14 which extend from one end of switch beam 14 to the other end of the switch beam.

In general, the insulating element may be arranged along any lateral portion of switch beam 14, including above and between the closing gate and the contact structure. In some embodiments, the insulating element may be arranged above and between the closing gate and the contact structure such that extended portions 26 are separated from switch beam 14. In such embodiments, the insulating element also should be arranged to allow the switch beam to remain electrically connected such that the gates may work properly. Such an arrangement of an insulating element is illustrated in the MEMS device of FIG. 7, which includes insulating element 49 separating extended portions 50 from switch beam 36. As further shown in FIG. 7, insulating element 49 may be arranged such that the insulating element also separates extended portions 50 from additional beams 44. Such an insulating element may also be included in the MEMS device of FIG. 2a and the other MEMS devices described herein. In this manner, the insulating element may be arranged to separate extended portions 26 from switch beam 14 and additional beams 20 in FIG. 2a. In such embodiments, the insulating element also should be arranged to allow the switch beam and the additional beams to remain electrically connected such that all of the gates may work properly.

Depending on the particular device being formed, the arrangement of the contact structure and the control elements (e.g., the gates) may vary from that of FIGS. 1–5 and the other embodiments illustrated in FIGS. 6–13. The control elements shown in the figures are preferably gate electrodes for electrostatically actuated movement as described below, but other forms of actuation are possible and contemplated. For example, an actuating member could be made from a magnetic material, and a coil could be used as a control element in the case of a magnetically-actuated device. Other types of actuation, such as piezoelectric or thermal actuation in which moving elements include materials of dissimilar polarity properties and thermal expansion coefficients, respectively, may also be compatible with at least some of the MEMS devices described herein. Another type of actuation that may be implemented for a MEMS device described herein includes out-of-plane comb drives. Therefore, each of these types of actuation may be implemented to provide positive opening forces beyond those provided in a simple cantilever design.

Exemplary embodiments of MEMS device 10 in different actuation states are illustrated in FIGS. 1 and 3–5. In particular, FIG. 1 illustrates MEMS device 10 in a non-actuated state in which switch beam 14 is not in contact with contact structure 18. In this manner, FIG. 1 illustrates a switch that is open. In such an embodiment, switch beam 14 preferably includes a material stiff enough to prevent contact between switch beam 14 and contact structure 18 when an actuation force is not applied to closing gate 16. Additional beam 20 also preferably includes a material stiff enough to prevent contact with contact structure 18, closing gate 16, and opening gate 22 when an actuation force is not applied to closing gate 16. Additional beam 20 also preferably includes a material stiff enough to prevent contact with opening gate 22 when an actuation force is applied to closing gate 16.

In an embodiment, a portion of switch beam 14 may come into contact with contact structure 18 upon actuation of the switch, as shown in FIG. 3. The portion of the switch beam that contacts the contact structure may include one or more recessed portions of the switch beam or one or more extended portions 26. Contact between the switch beam and the contact structure may be caused by electrostatically actuating closing gate 16 as illustrated by the curvature of switch beam 14 over closing gate 16. In other words, a voltage may be applied to closing gate 16, thereby introducing an electrostatic force to pull down switch beam 14. The applied voltage may be approximately 5 V or higher. However, the applied voltage may vary significantly depending on the dimensions and the materials used in the device. Preferably, the voltage is small enough such that switch beam 14 and additional beam 20 do not contact closing gate 16. Preferably the voltage is also small enough such that additional beam 20 does not contact opening gate 22. Such voltages may vary depending on the flexibility of switch beam 14 and additional beam 20 and the size and arrangement of contact structure 18 and closing gate 16. In this manner, the material used for switch beam 14 and additional beam 20, the arrangement of the device components, and the voltage required to actuate MEMS device 10 may be optimized to produce a device that may be actuated by a low voltage and yet to not undesirably cause contact with closing gate 16.

Actuation of the closing gate also may activate one or more of the additional beams. For example, if the closing gate is located under the additional beams, as shown in FIG. 2a, actuation of closing gate 16 may create an attractive electrostatic force between closing gate 16 and additional beam 20. Actuation of the closing gate brings a portion of the additional beam toward the contact structure. As shown in FIG. 3, additional beam 20 is closer to contact structure 18 upon actuation of closing gate 16, than before actuation of closing gate 16, as shown in FIG. 1. In addition, because actuation of the closing gate brings additional beam 20 closer to, and in some embodiments in contact with, contact structure 18, a force with which switch beam 14 contacts contact structure 18 may be increased.

Additional beam 20 may include additional fulcrum 28 disposed between a first end of additional beam 20 proximate to the contact structure and a second end of the additional beam proximate to opening gate 22. In other words, the additional fulcrum may be located between an end of the additional beam coupled to switch beam 14 and a free end of the additional beam. A distance between the first end of the additional beam and the additional fulcrum may be shorter than a distance between the second end of the additional beam and the additional fulcrum. In one embodiment, the distance between the second end of the additional beam and the additional fulcrum may be about 2 to about 3 times longer than the distance between the first end of the additional beam and the additional fulcrum. The positioning of the additional fulcrum may vary, however, depending on, for example, the force that the additional beam is to apply on the switch beam. Additional fulcrum 28 may be a recessed portion, or a "dimpled portion," spaced from both ends of the additional beam. Therefore, the additional fulcrum may act as a pivot structure for additional beam 20. A pivot structure of additional beam 20 may not need to be as robust as a pivot structure of a conventional teeter-totter design. Therefore, the additional beam may essentially be a teeter-totter structure without support springs at the additional fulcrum. As shown in FIG. 3, actuation of closing gate 16 may bring additional fulcrum 28 of additional beam 20 into contact with an upper surface of substrate 12.

In FIGS. 1–13 and the descriptions herein, the dimples, additional dimples, fulcrums, and additional fulcrums are described as contours being formed in the main beams and additional beams so as to localize contacts and control the clearances between the beams and regions opposite them on the substrate. It should be obvious that planar beams could be used equally well when raised portions of the substrate can be provided to similarly control clearance and localize potential contact. Again, a combination of contours formed in the beam and raised portions on the substrate could also provide the desired function.

Additional fulcrum 28 of various depths may be formed by appropriately masking sacrificial layers during fabrication of the MEMS device. In addition, although an upper surface of additional beam 20 is shown to be non-planar proximate additional fulcrum 28 in FIG. 1, in an alternative embodiment, the upper surface of additional beam 20 may be substantially planar proximate additional fulcrum 28, and optionally across an entire length of the additional beam. In this manner, the additional fulcrum may be formed as material extending from a lower surface of additional beam 20 (i.e., a surface of the additional beam closest to substrate 12). In other words, the additional beam may be substantially flat and the additional fulcrum may be material extending from a lower surface of the additional beam. In some embodiments, the additional fulcrum may extend from a lower surface of the additional beam to an upper surface of substrate 12, in a manner similar to support structure 24 which, as shown in FIG. 1, extends from a lower surface of switch beam 14 to an upper surface of substrate 12. The additional fulcrum may be formed of the same material as the additional beam or a different material than the additional beam. In some embodiments, other fulcrums and dimples of additional beams and switch beams described herein may be formed and configured in a similar manner.

Actuation of closing gate 16 may also bring the additional beam toward opening gate 22. For example, additional beam 20 is closer to opening gate 22 upon actuation of closing gate 16, as shown in FIG. 3, than before actuation of closing gate 16, as shown in FIG. 1. Therefore, the gap between the additional beam and the opening gate is reduced by actuation of closing gate 16, thereby increasing the effectiveness of the additional beam for opening the switch. For example, an attractive force between the opening gate and the additional beam may be approximately proportional to the inverse of the square of the gap. In this manner, reducing the gap may increase the attractive force. In one embodiment, the gap between the additional beam and the opening gate after actuation of closing gate 16 may be less than about 2 microns. Therefore, the opening gate may have a relatively small clearance and relatively high force when actuated.

The switch may be considered closed when a portion of switch beam 14 is in contact with contact structure 18, as shown in FIG. 3. After an electrostatic force is applied to closing gate 16 to bring switch beam 14 into contact with contact structure 18, switch beam 14 may be pulled away from contact structure 18 in a variety of manners. For example, the closing voltage may simply be disconnected from closing gate 16 to deflect switch beam 14 from contact structure 18. However, in many cases, the release of such a voltage may not be sufficient to deflect switch beam 14 from contact structure 18 due to stiction problems discussed earlier, particularly when using low voltage levels. An alternative method of pulling switch beam 14 away from contact structure 18 is to actuate opening gate 22, as shown in FIG. 4. The actuation and closing voltages may be optimized such that a minimal amount of voltage may be used to activate each gate.

Actuation of opening gate 22 causes additional beam 20 to bend such that a portion of the additional beam contacts an upper surface of substrate 12, as shown in FIG. 4. Advantageously, fulcrum 28 of additional beam 20 contacts the substrate to provide leveraged force moving switch beam 14 away from contact structure 18. The portion of the additional beam that contacts substrate 12 may also include the free end, or the distant end, of the additional beam spaced from the switch beam. Bending of the additional beam develops a prying force on switch beam 14 proximate contact structure 18 in a direction away from the contact structure. Therefore, actuation of the opening gate causes additional beam 20 to apply a force on switch beam 14 in a direction away from contact structure 18. In this manner, one or more additional beams may essentially function as "prybars" when electrostatically actuated, providing an active opening force that is at least a portion of a force sufficient to open the switch. For example, as shown in FIGS. 3–4, the additional beam may act as a lever, pivoting on additional fulcrum 28, and prying the switch beam out of contact with the contact structure.

In another embodiment, the opening gate may be used to modulate a contact force of the closed switch. For example, an opening force, provided by actuating the additional beam with the opening gate, may be used in an embodiment to advantageously reduce the contact force created by contact between the switch beam and the contact structure upon actuation of the switch beam, after switching has occurred (i.e., while the switch beam is in contact with the contact structure). In this manner, reducing the contact force during extended periods of closed switch operation may reduce its tendency to stick in the closed position.

Additional beam 20 may include dimpled portion 30 proximate opening gate 22. The dimpled portion may be configured to contact substrate 12 upon actuation of opening gate 22. The dimpled portion may have a depth such that additional beam 20 does not contact opening gate 22 upon actuation of the opening gate. In this manner, actuation of opening gate 22 may not cause shorting between additional beam 20 and opening gate 22. Therefore, the depth of the dimpled portion may vary depending upon the height of opening gate 22, the voltage applied to opening gate 22 upon actuation, a position of opening gate 22 with respect to additional beam 20, and various properties of additional beam 20 such as stiffness and/or thickness. Each additional beam may include one or more dimpled portions proximate the opening gates, and a depth of each of the dimpled portions may vary independently. For example, each of the dimpled portions proximate the opening gate may have the same or different depths. If the switch beam or the additional beam includes dimpled portions proximate the contact structure, dimpled portion 30 may or may not have the same depth, dimensions, or shape as these dimpled portions. In addition, dimpled portion 30 may or may not have the same depth, dimensions, or shape as additional fulcrum 28. Dimpled portions of various depths may be formed by appropriately masking sacrificial layers during fabrication of the MEMS device, as described above. In addition, the depths of the dimpled portions may be varied to optimize the positive opening force levels. In addition, or alternatively, substrate 12 may include one or more raised portions (not shown) proximate to where additional beam 20 contacts substrate 12. The raised portions may be configured as described herein.

In some embodiments, the MEMS device may also include an additional contact structure (not shown) spaced below the additional beam and formed on substrate 12 proximate to where additional beam 20 contacts substrate 12 upon actuation of the opening gate. For example, the additional contact structure may be arranged on the substrate such that dimpled portion 30 of additional beam 20 can contact the additional contact structure. In some embodiments, the additional contact structure may allow a signal to pass to and/or from additional beam 20 when additional beam 20 is in contact with the additional contact structure. In this manner, MEMS device may be configured as a multi-pole switch. The additional contact structure may be configured according to any of the embodiments of contact structure 18 described herein.

The force applied to switch beam 14 by additional beam 20 may be a portion of an opening force for the closed switch. The portion of the opening force is substantially independent of a force stored in the closed switch because the force is applied by a beam external to the switch. For example, in the embodiments illustrated in FIGS. 1–5, the force that additional beam 20 applies to switch beam 14 is substantially independent of an inherent opening force of the switch beam due to deformation. The opening force is a mechanical force, unlike other approaches for providing an opening force to a switch such as providing an attractive electrostatic force between the main beam of a switch and an additional electrode spaced above the main beam. Furthermore, MEMS device 10 is configured for active opening with less complex material sets and lower actuation currents than magnetically actuated structures with active opening.

A combination of the opening force provided by the additional beam and the force stored in the closed switch may be sufficient to open the switch after removal of a force associated with actuation of the switch such as an attractive force between switch beam 14 and closing gate 16. For example, a combination of the opening force provided by the additional beam and the force stored in the closed switch may be sufficient to overcome a sticking force tending to keep the switch closed after removal of a force associated with actuation of the switch. Therefore, after reduction, or even removal, of a voltage applied to closing gate 16, switch beam 14 may be moved away from contact structure 18, as shown in FIG. 5. The force applied to switch beam 14 by additional beam 20 may be altered by varying the voltage, the length of the additional beam, thickness and/or stiffness of the additional beam, the distance from contact structure 18 to additional fulcrum 28, the distance from dimpled portion 30 to contact structure 18, and the depths of additional fulcrum 28 and dimpled portion 30.

As described above, a mechanical force may be externally applied to switch beam 14 by additional beam 20 prior to reducing an attractive force between the switch beam and closing gate 16. In another embodiment, deflecting switch beam 14 from contact structure 18 may include increasing the actuation voltage applied to opening gate 22 after the release of the closing voltage from closing gate 16. In an alternative embodiment, the mechanical force may be externally applied to switch beam 14 by additional beam 20 after reduction of an attractive force between the switch beam and closing gate 16. The actuation voltage applied to the opening gate in such an embodiment may be smaller than the actuation voltage in an embodiment in which the closing voltage is released subsequent to the application of the actuation voltage. In another embodiment, the mechanical force may be externally applied to switch beam 14 by additional beam 20 substantially simultaneously with reduction of an attractive force between the switch beam and closing gate 16.

As further shown in FIG. 5, additional beam 20 may remain in contact with an upper surface of substrate 12 proximate opening gate 22 by application of a voltage to opening gate 22 until switch beam 14 has moved away from contact structure. In addition, additional fulcrum 28 may not remain in contact with substrate 12 after switch beam 14 has moved away from contact structure 18, as shown in FIG. 5. However, depending upon the attractive force between additional beam 20 and opening gate 22, the stiffness of the additional beam, the stiffness of the switch beam, and the lengths of the additional beam from the fixed and free ends to the additional fulcrum, the additional fulcrum may or may not remain in contact with substrate 12 after switch beam 14 has moved away from contact structure 18. After opening of the switch, the opening gate may be released, and additional beam 20 may return to its position before closing of the switch, as shown in FIG. 1.

FIG. 2b illustrates another embodiment of MEMS device 10 that includes two switch beams 14. Elements of FIGS. 2a and 2b that may be similarly configured, except for the differences described herein, have been indicated with the same reference numerals. The two switch beams may be similarly configured or may be configured differently. For example, as shown in FIG. 2b, both of the switch beams may be cantilever beams. In another embodiment, both of the switch beams may be teeter-totter beams. In alternative embodiments, one of the switch beams may be a cantilever beam, and the other switch beam may be a teeter-totter beam. Each switch beam is spaced above a different closing gate 16 and a different contact structure 18. MEMS device 10 may or may not also include additional contact structure 18 spaced between the two contact structures.

In addition, MEMS device 10 includes only one additional beam 20. The one additional beam may be coupled to both switch beams. The additional beam may not be spaced above either of the closing gates. Instead, the additional beam may be spaced above opening gate 22 and optionally contact structure 18. In an alternative embodiment, the additional beam may be spaced above a closing gate. In another embodiment, one closing gate may extend under the additional beam and both of the switch beams. The additional beam also has more than one recessed portions 30 located between the free end of the additional beam and the opening gate. Although the additional beam is shown in FIG. 2b to extend from the switch beams away from the contact structures and toward the fixed end of the cantilever beams, the additional beam may extend from the switch beam in other directions. For example, the additional beam may extend from the switch beam away from the fixed ends of the cantilever beams and in a direction substantially parallel to the cantilever beams. In this manner, the additional beam and the cantilever beams may extend from the contact region in substantially opposite directions. The MEMS device illustrated in FIG. 2b may be further configured as described herein. The additional beam may be configured as described herein to provide a positive opening force for both of the cantilever beams. In this manner, one additional beam may provide a positive opening force for more than one main beam of a switch.

FIGS. 6–11 illustrate various embodiments of MEMS device 32 arranged upon substrate 34. Substrate 34 may include any of the substrates described herein. MEMS device 32 is different from the MEMS device illustrated in FIGS. 1–5 in that main switch beam 36 of MEMS device 32 is a teeter-totter beam instead of a cantilever beam. Such a MEMS device may be commonly referred to as a "pivoted switch." For example, switch beam 36 includes main fulcrum 38 located between the ends of the switch beam and spaced from a contact structure, instead of support structure 24 as shown in FIGS. 1–5. Although main fulcrum 38 is shown in flat contact with substrate 34, main fulcrum is not fixedly attached to the upper surface of substrate 34. In this manner, main fulcrum 38 can "rock" on its lower corners 38a and 38b, as described herein. The device may also include support springs 39 at main fulcrum 38, as shown in FIG. 7. A portion of the switch beam on one side of the main fulcrum may be proximate to a contact region. The portion of the switch beam on the other side of the main fulcrum may be spaced from the contact region and may be commonly referred to as a "return arm." In one embodiment, the switch beam does not include such a return arm. It is to be understood, however, that the MEMS devices described herein may also include main beams other than a teeter-totter beam or a cantilever beam. For example, the main switch beam of MEMS device 10 or 32 may include a switch beam that is supported on both ends by a support structure, which may be commonly referred to as a "strap." The main switch beam may also include any other appropriate structure known in the art.

Switch beam 36 is spaced above closing gate 40 and contact structure 42. Closing gate 40 and contact structure 42 may be formed on an upper surface of substrate 34. The closing gate and the contact structure may be arranged below the switch beam and on the same side of main fulcrum 38. In one embodiment, MEMS device may include more than one closing gate and more than one contact structure arranged below the switch beam. Each of the closing gates and each of the contact structures may be arranged on the same side of the main fulcrum. In another embodiment, MEMS device 32 may include insulating structures (not shown) between closing gate 40 and contact structure 42. Switch beam 36, closing gate 40, and contact structure 42 may form at least a portion of a switch. MEMS device 32 may also include return gate 43 spaced below switch beam 36 and on the opposite side of the main fulcrum from closing gate 40 and contact structure 42. The return gate may be formed on an upper surface of substrate 34. As described above, however, the switch beam may not include an arm, or a "return arm," on the opposite side of the main fulcrum from closing gate 40 and contact structure 42. In such an embodiment, the MEMS device may not include the return gate.

In an embodiment, MEMS device 32 also includes additional beam 44 coupled to the switch. Additional beam 44 may be spaced above opening gate 48. Opening gate 48 may be formed on an upper surface of substrate 34. In addition, additional beam 44 may be spaced above more than one opening gate. Additional beam 44 includes additional fulcrum 46 disposed between a first end of additional beam 44 proximate to the contact structure and a second end of the additional beam proximate to opening gate 48. A distance between the first end of the additional beam and the additional fulcrum may be shorter than a distance between the second end of the additional beam and the additional fulcrum. In one embodiment, the distance between the second end of the additional beam and the additional fulcrum may be about 2 to about 3 times longer than the distance between the first end of the additional beam and the additional fulcrum. The positioning of the additional fulcrum may vary, however, depending on, for example, the force that the additional beam is to apply on the switch beam. Additional fulcrum 46 may be a recessed portion or a "dimpled portion" spaced from both ends of the additional beam. In this manner, additional beam 44 may be configured as a teeter-totter beam with or without support springs at additional fulcrum 46. A pivot structure of additional beam 44 may not need to be as robust as a pivot structure of switch beam 36 or a conventional teeter-totter design. In this manner, MEMS device 32 is a device including more than one teeter-totter beams.

As shown in FIG. 6, main fulcrum 38 has a lower surface that is not coplanar with a lower surface of additional fulcrum 46. In other embodiments, the lower surface of main fulcrum and the lower surface of additional fulcrum 46 may be coplanar. In addition, main fulcrum 38 has a height that is different than a height of additional fulcrum 46. For example, a height of main fulcrum 38 may be greater than a height of additional fulcrum 46. In this manner, additional beams 44 may have different fulcrum heights than switch beam 36 to facilitate high opening forces provided by the additional beams. In some embodiments, additional fulcrum 46 may be approximately collinear with main fulcrum 38, as shown in FIG. 6. In other embodiments, a position of additional fulcrum 46 may be offset from a position of main fulcrum 38. Closing gate 40 and optionally contact structure 42 may be spaced below additional beam 44 on one side of additional fulcrum 46, and opening gate 48 may be spaced below additional beam 44 on the other side of additional fulcrum 46. Opening gate 48 may be formed on an upper surface of substrate 34. Return gate 43 may or may not be spaced below additional beam 44 on the same side of additional fulcrum 46 as opening gate 48.

MEMS device 32 may also include at least one other additional beam 44 coupled to the switch, as shown in FIG. 7. The other additional beam may be configured as described herein. In addition, the two additional beams 40 may be similarly configured or may be configured differently. In other embodiments, the MEMS device may include more than two additional beams. In another embodiment, the MEMS device may include more than one main switch beam and one additional beam. The main switch beams may be similarly configured or may be configured differently. The additional beam may be configured to provide a positive opening force for each of the main switch beams as described herein.

Additional beam 44 extends from switch beam 36 proximate the contact structure. Additional beam 44 may be coupled to switch beam 36 as described above. For example, additional beam 44 may be coupled to switch beam 36 such that the additional beam may apply a force on the switch beam in a direction away from contact structure 40. If switch beam 36 is a teeter-totter as shown in FIGS. 6–13, the additional beam may be coupled to the free end of the teeter-totter beam proximate the contact region. The free end of the additional beam may be disposed proximate the opening gate. Additional beam 44 may extend from switch beam 36 away from contact structure 44 and toward opening gate 48. In addition, the additional beam may extend from the free end of the teeter-totter beam toward the main fulcrum of the teeter-totter beam. For example, additional beam 44 may extend in a direction approximately parallel to a length of the switch beam, as shown in FIG. 7. In some embodiments, the additional beam may or may not extend beyond the main fulcrum.

Figure 9:
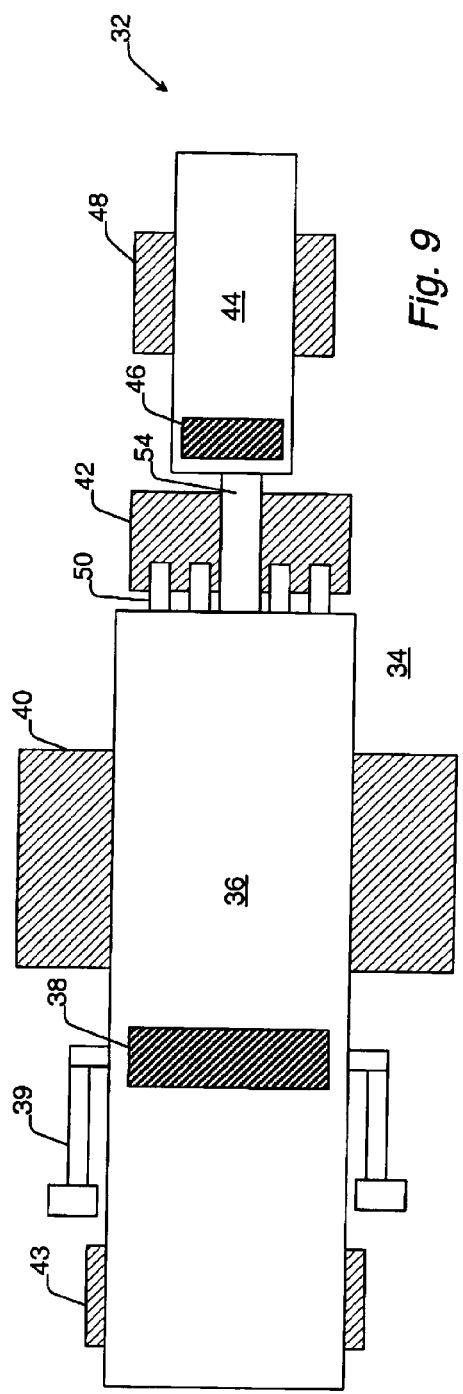
Figure 10:
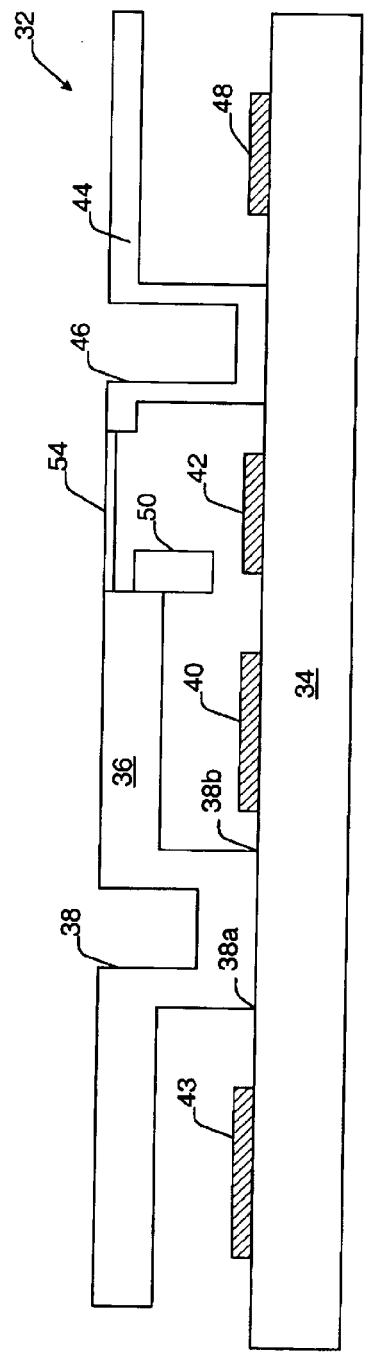
FIG. 10 depicts a partial side view of the microelectromechanical device of FIG. 9.

Alternatively, the additional beam may extend from the free end of the teeter-totter beam away from its main fulcrum. For example, additional beam 44 may extend in a direction at an angle to the length of switch beam 36. In one embodiment, as shown in FIG. 8, additional beams 44 may extend in a direction substantially perpendicular to a length, or the axial direction, of switch beam 36. In another alternative embodiment, as shown in FIGS. 9 and 10, additional beam 44 may be collinear with switch beam 36. In such an embodiment, additional beam 44 may be coupled to switch beam 36 by flexure 54. Flexure 54 may be formed of the same or different materials as switch beam 36 and/or additional beam 44. In addition, flexure 54 may have a thickness and a width approximately equal to or different than a thickness and a width of switch beam 36 and/or additional beam 44. For example, as shown in FIGS. 9 and 10, the width and thickness of flexure 54 may be smaller than the width and thickness of switch beam 36 and additional beam 44. A thickness and a material of flexure 54 may be selected such that flexure 54 may bend upon actuation of closing gate 40 and/or opening gate 48. Furthermore, flexure 54 may have a different stiffness than switch beam 36 and additional beam 44. Such a flexure may be included in other embodiments of a MEMS device described herein such as the MEMS device illustrated in FIG. 8.

Elements of MEMS device 32 illustrated in FIGS. 6–13 that may be similarly configured, except for the differences described herein, have been indicated with the same reference numerals. For example, one or more characteristics of the different embodiments of MEMS devices illustrated in FIGS. 7–9 may vary depending upon a direction in which the additional beams extend from the main beam. In the embodiments shown in FIGS. 8 and 9, for example, a length of closing gate 40 may be less than a length of closing gate 40 in the embodiment shown in FIG. 7. The lengths of the closing gate may be shorter in the embodiments of FIGS. 8 and 9 because the closing gate does not extend under the additional beams. In contrast, the closing gate in the embodiment of FIG. 7 extends under the two additional beams of this embodiment. Other characteristics of the embodiments illustrated in FIGS. 6–10 may be similarly varied as described herein. For example, each of the embodiments illustrated in FIGS. 6–10 may be altered to include more than one main switch beam and only one additional beam as described with respect to FIG. 2b.

Closing gate 40, return gate 43, and opening gate 48 may include any of the materials described above. In addition, one or more of gates 40, 43, and 48 may include the same material or different materials. Gates 40, 43, and 48 are arranged under switch beam 36 and additional beam 44 such that the lengths of gates 40, 43, and 48 are perpendicular to the length of switch beam 36 and additional beam 44. Closing gate 40 may extend beyond the periphery of switch beam 36 and one or more additional beams 44, as shown in FIG. 7. Alternatively, the combined width of switch beam 36, additional beams 44, and a spacing between each of the additional beams and switch beam 36 may be approximately equal to a length of the closing gate such that the closing gate resides entirely under the switch beam and the additional beams. In another alternative, a length of the closing gate may be approximately equal to the width of switch beam 36 such that the closing gate resides entirely under the switch beam. In a further embodiment, the closing gate may extend beyond the periphery of the switch beam but not under the additional beams. In another alternative, closing gate 40 may include separate gate electrodes. The separate gate electrodes may be spaced below the switch beam or one of the additional beams.

Return gate 43 may have a length equal to or greater than the width of the switch beam. In addition, a length of return gate 43 may be less than the combined width of switch beam 36 and a spacing between the switch beam and each additional beam 44. In this manner, return gate 43 may not extend under additional beams 44, as shown in FIG. 7. In an alternative embodiment, return gate may extend under switch beam 36 and one or more of the additional beams.

An opening gate may be spaced below each of the additional beams 44. Opening gate 48 may extend beyond the periphery of additional beam 44 below which it is spaced, as shown in FIG. 7. Alternatively, the lengths of the opening gates may be substantially equal to the width of the additional beams. In another alternative, one opening gate may be spaced below both of the additional beams. In this embodiment, the one opening gate may have a length equal to or greater than the combined width of the additional beams and a spacing between the additional beams. In such an embodiment, the one opening gate may or may not extend under switch beam 36 depending on a length of the switch beam, a length of the additional beam, and a position of the opening gate. In addition, as shown in FIG. 7, the lengths of gates 40 and 48 may be substantially different. For example, closing gate 40 may have a length greater than a length of opening gate 48. Furthermore, as shown in FIG. 7, the widths of gates 40 and 48 may be substantially different. For example, closing gate 40 may be wider than opening gate 48.

Contact structure 42 may include any of the materials described above. Contact structure 42 may also include the same material as, or different materials than, gates 40, 43, and/or 48. If the contact structure includes a conductive material, contact structure 42 may serve as a conductive pad. In this manner, contact structure 42 may allow a signal to pass to and/or from switch beam 36 when switch beam 36 is in contact with contact structure 42. In some embodiments, contact structure 42 may include a non-conductive material as described above or a non-conductive material arranged upon a conductive material.

As with closing gate 40, contact structure 42 may be arranged under switch beam 36 and a length of the contact structure may extend perpendicular to the length of switch beam 36. In some embodiments, contact structure 42 may extend beyond, or may reside entirely under, the periphery of switch beam 36. In another embodiment, contact structure 42 may be arranged under switch beam 36 and additional beams 44. In such an embodiment, contact structure 42 may extend beyond, or may reside entirely under, the periphery of switch beam 36 and additional beams 44. In some embodiments, contact structure 42 may include a single structure. In other embodiments, as shown in FIG. 7, contact structure 42 may include multiple sections spaced laterally from each other along the width of the switch beam, or optionally along the width of the switch beam and the additional beams. Although FIG. 7 illustrates two sections of contact structure 42, it is to be understood that the contact structure may include any number of multiple sections. In such an embodiment, the multiple sections of contact structure 42 may include the same or different materials. In another such embodiment, the multiple sections of contact structure 42 may have the same or different dimensions. Furthermore, the upper surface of contact structure 42 may be above or below the upper surfaces of gates 40, 43, and 48. Alternatively, contact structure 42 may be approximately the same height as gates 40, 43, and 48.

As described above, switch beam 36 is preferably spaced above closing gate 40, contact structure 42, and optionally return gate 43. For example, switch beam 36 may be spaced above closing gate 40, contact structure 42, and optionally return gate 43 by main fulcrum 38. Main fulcrum 38 may be configured such that a lower surface of switch beam 36 is spaced above closing gate 40, contact structure 42, and optionally return gate 43, as shown in FIG. 6. In addition, additional beam 44 may be spaced above gates 40, 43, and 48 and optionally contact structure 42 by additional fulcrum 46 when additional fulcrum 46 is brought into contact with an upper surface of the substrate. Additional fulcrum 46 may be configured such that a lower surface of additional beam 44 may be spaced above gates 40, 43, and 48 and optionally contact structure 42 when the additional fulcrum is in contact with the upper surface of the substrate, as shown in FIG. 11.

Switch beam 36 and additional beam 44 may include any of the materials described above. In addition, switch beam 36 and additional beam 44 may be formed of the same materials or different materials. Furthermore, switch beam 36 and additional beam 44 may have different thicknesses. In addition, a stiffness of switch beam 36 may be different than a stiffness of additional beam 44. Preferably, switch beam 36 includes a material that may adequately bend in response to the introduction of an actuation force such as an electrostatic or other force between closing gate 40 and switch beam 36. Switch beam 36 may also include a material that may adequately bend in response to the introduction of an actuation force between return gate 43 and switch beam 36. In addition, additional beam 44 includes a material that may adequately bend in response to the introduction of an actuation force such as an electrostatic or another force between opening gate 48 and the additional beam. Alternatively, switch beam 36 and additional beam 44 may bend due to residual stresses contained within the beams. In an embodiment in which an electrostatic force is applied, relatively flexible materials advantageously allow the device to be actuated at a relatively low voltage.

In addition, or alternatively, switch beam 36 may include one or more recessed portions and/or one or more extended portions. For example, switch beam 36 may include a recessed portion or extended portion 50, which may be commonly called a "finger," spaced above contact structure 42, as shown in FIG. 6. In some embodiments, switch beam 36 may include multiple recessed portions or multiple extended portions 50 over contact structure 42, as shown in FIG. 7. The multiple recessed portions or multiple extended portions may be arranged over one or more sections of contact structure 42. For example, as shown in FIG. 7, multiple extended portions 50 are arranged over two different sections of contact structure 42. In an alternative embodiment, switch beam 36 may not include any recessed portions or extended portions. In addition, or alternatively, contact structure 42 may include one or more raised sections (not shown) arranged on its upper surface. The raised sections may be configured as described above. Such raised sections and/or recessed or extended portions of the beam may increase localization of contact between switch beam 36 and contact structure 42 and increase break through of contamination that may reside upon the contact interface between contact structure 42 and the overlying portion of the beam.

In an embodiment, MEMS device 32 may be adapted to pass a signal as described above. In one embodiment, the MEMS device may be configured to pass a signal from one end of the switch beam to another, and switch beam 36 may include a continuous layer of conductive material as described above. In another embodiment, MEMS device 32 may be configured to pass a signal from a first end of the switch beam to the second end of the switch beam and to contact structure 42. In such an embodiment, contact structure 42 preferably includes a conductive material without a non-conductive material formed thereon.

In some cases, switch beam 36 may include an insulating element as described above. In one example illustrated in FIG. 7, insulating element 49 may be arranged above and between the closing gate and the contact structure such that extended portions 50 are separated from switch beam 36. In such embodiments, the insulating element also should be arranged to allow the switch beam to remain electrically connected such that the gates may work properly. As further shown in FIG. 7, insulating element 49 may be arranged such that the insulating element also separates extended portions 50 from additional beams 44. In such embodiments, the insulating element also should be arranged to allow the switch beam and the additional beams to remain electrically connected such that all of the gates may work properly.

Exemplary embodiments of MEMS device 32 in different actuation states are illustrated in FIGS. 6 and 11–13. In FIGS. 6 and 11–13, switch beam 36 is configured as a teeter-totter rocking on lower corners 38*a* and 38*b* of main fulcrum 38. However, the same actuation states may apply if MEMS device 32 is a cantilever, as shown in FIGS. 1–5. In particular, FIG. 6 illustrates MEMS device 32 in a non-actuated state in which switch beam 36 is not in contact with contact structure 42. In this manner, FIG. 6 illustrates a switch that is open. In such an embodiment, switch beam 36 preferably includes a material stiff enough to prevent contact between the beam and contact structure 42 when an actuation force is not applied to closing gate 40. Additional beam 44 may also include a material to prevent contact between the additional beam and contact structure 42 when an actuation force is not applied to closing gate 40.

In an embodiment, contact between a portion of switch beam 36 and contact structure 42, as shown in FIG. 11, may be caused by electrostatically actuating closing gate 40. In other words, a voltage may be applied to closing gate 40, thereby introducing an electrostatic force to pull down switch beam 36, which causes switch beam 36 to rock onto lower corner 38*b*. The portion of the switch beam that contacts the contact structure may include a recessed portion of the switch beam or extended portion 50. The applied voltage may be approximately 5 V or higher. However, the applied voltage may vary significantly depending on the dimensions and the materials used in the device. Preferably, the voltage is small enough such that switch beam 36 and additional beam 44 do not contact closing gate 40. Such a voltage may be dependent on the flexibility of switch beam 36 and additional beam 44 and the size and arrangement of contact structure 42 and closing gate 40. In this manner, the material used for switch beam 36 and additional beam 44, the arrangement of the device components, and the voltage that actuates MEMS device 32 may be optimized to produce a device that may be actuated by a relatively low voltage and yet may not undesirably cause contact with closing gate 40.

Additional beam 44 preferably includes a material stiff enough to prevent contact between the additional beam and closing gate 40 or opening gate 48 when an actuation force is applied to closing gate 40. Actuation of the closing gate also may actuate one or more of the additional beams. For example, if the closing gate is located under the additional beams, as shown in FIG. 7, actuation of closing gate 40 may create an attractive force between closing gate 40 and additional beam 44. Actuation of the closing gate brings a portion of the additional beam toward the contact structure. As shown in FIG. 11, additional beam 44 is closer to contact structure 42 upon actuation of closing gate 40, than before actuation of closing gate 40, as shown in FIG. 6. In addition, because actuation of the closing gate brings additional beam 44 closer to, and in some embodiments in contact with, contact structure 42, a force with which switch beam 36 contacts contact structure 42 may be increased.

As shown in FIG. 11, actuation of closing gate 40 may bring additional fulcrum 46 of additional beam 44 into contact with an upper surface of substrate 34. Actuation of the closing gate may also bring the additional beam toward opening gate 48. For example, additional beam 44 is closer to opening gate 48, as shown in FIG. 11, than before actuation of closing gate 40, as shown in FIG. 6. Therefore, the gap, or the "clearance," between the additional beam and the opening gate is reduced by actuation of closing gate 40 thereby increasing the effectiveness of the additional beam for opening the switch as described above. In one embodiment, the gap between the additional beam and the opening gate after actuation of closing gate 40 may be less than about 2 microns. Therefore, the opening gate has a smaller clearance and higher force than the return gate because the gap between the switch beam and the return gate is greater than the gap between the additional beam and the opening gate. For at least the same reasons, the additional beam may be more effective than a return gate for opening a switch that does not include additional beams as described herein.

The switch may be considered closed when a portion of switch beam 36 is in contact with contact structure 42, as shown in FIG. 11. In an embodiment in which an electrostatic force is applied to closing gate 40 to bring switch beam 36 into contact with contact structure 42, switch beam 36 may be pulled away from contact structure 42 in a variety of manners. For example, the closing voltage may be disconnected as described above. In some cases, however, the release of such a voltage may not be sufficient to deflect switch beam 36 from contact structure 42 due to stiction problems discussed earlier, particularly when using low voltage levels. In addition, the return gate may be actuated in combination with disconnection of the closing voltage. However, since the clearance at the closed side of the switch beam is smaller than at the open side, opening the switch solely with the return gate may require a relatively large voltage as discussed earlier.

An alternative method of pulling switch beam 36 away from contact structure 42 is to actuate opening gate 48, as shown in FIG. 12. In addition, such a method may or may not include actuating return gate 43. The opening and closing voltages may be optimized such that a minimal amount of voltage may be used to actuate each gate. Actuation of opening gate 48 causes additional beam 44 to bend such that a portion of the additional beam contacts substrate 34. The portion of the additional beam that contacts substrate 34 may include the free end, or the distant end, of the additional beam spaced from the contact region. Bending of the additional beam develops a prying force on switch beam 36 proximate contact structure 42. Therefore, actuation of the opening gate causes additional beam 44 to apply a force on switch beam 36 in a direction away from contact structure 42. In this manner, one or more additional beams 44 may essentially function as "pry-bars" when electrostatically actuated, providing force to pull the switch beam away from the contact structure to open the switch. For example, as shown in FIGS. 11–13, the additional beam may act as a lever, pivoting on additional fulcrum 46, and prying the switch beam out of contact with the contact structure.

Additional beam 44 may include dimpled portion 52 proximate opening gate 48. The dimpled portion may be configured to contact substrate 34 upon actuation of opening gate 48. The dimpled portion may have a depth such that additional beam 44 does not contact opening gate 48 upon actuation of the opening gate. In this manner, actuation of opening gate 48 may not cause shorting between additional beam 44 and opening gate 48. Therefore, the depth of the dimpled portion may vary depending upon the height of opening gate 48, the voltage applied to opening gate 48 upon actuation, a position of opening gate 48 with respect to additional beam 44, and various properties of additional beam 44 such as stiffness and/or thickness. Each additional beam may include one or more dimpled portions proximate the opening gate, and a depth of each of the dimpled portions may vary independently. For example, each of the dimpled portions proximate the opening gate may have the same or different depths. If the switch beam or the additional beam includes dimpled portions proximate the contact structure, dimpled portion 30 may or may not have the same depth as these dimpled portions as described above, which may provide the ability to optimize the positive opening force levels. Dimpled portion 52 also may or may not have the same depth as additional fulcrum 46. In addition, or alternatively, substrate 34 may include one or more raised portions (not shown) proximate to where additional beam 44 contacts substrate 34.

In some embodiments, the MEMS device may also include an additional contact structure (not shown) formed on substrate 34 proximate to where additional beam 44 contacts substrate 34 upon actuation of the opening gate. For example, in one embodiment, the additional contact structure may be arranged on the substrate such that dimpled portion 52 of additional beam 44 can contact the additional contact structure. In some embodiments, the additional contact structure may allow a signal to pass to and/or from additional beam 44 when additional beam 44 is in contact with the additional contact structure. In this manner, MEMS device may be configured as a multi-pole switch. The additional contact structure may be configured according to any of the embodiments of contact structure 42 described herein.

The force applied to switch beam 36 by additional beam 44 may be a portion of an opening force for the closed switch. The portion of the opening force is substantially independent of a force stored in the closed switch because the force is applied by a beam external to the switch. For example, the force that additional beam 44 applies to switch beam 36 is substantially independent of an inherent opening force of the main beam due to deformation and a force stored in pivot springs of the switch beam. In contrast, the force applied to switch beam 36 by return gate 43 is not independent of an inherent opening force stored in the closed switch because the force is applied by actuation of the main beam of the switch (i.e., switch beam 36). For example, the opening force provided by actuation of the return gate varies depending on deformation of the main switch beam caused by closing the switch and a stiffness of the main switch beam. Furthermore, the opening force provided by the additional beams is a mechanical force, unlike other approaches for providing an opening force to a switch such as providing an attractive electrostatic force between the main beam of a switch and an additional electrode (i.e., return gate 43) spaced above or below the main switch beam. In addition, additional beam 44 may provide active opening for MEMS device 32 with less complex material sets and lower actuation currents than magnetically actuated structures with active opening.

A combination of the opening force provided by the additional beam, a force stored in the pivot springs of the MEMS device, and optionally a force provided by actuation of return gate 43 may be sufficient to open the switch after removal of a force associated with actuation of the switch such as an attractive force between switch beam 36 and closing gate 40. For example, a combination of the opening force provided by the additional beam, the force stored in the pivot springs, and optionally a force provided by actuation of the return gate may be sufficient to overcome a sticking force tending to keep the switch closed after removal of a force associated with actuation of the switch. Therefore, after reduction, or even removal, of a voltage applied to closing gate 40, switch beam 36 may be moved away from contact structure 42, as shown in FIG. 13. The force applied to switch beam 36 by additional beam 44 may be altered by varying the length of the additional beam, the distance from contact structure 42 to additional fulcrum 46, the distance from dimpled portion 52 to additional fulcrum 46, and the depths of additional fulcrum 46 and dimpled portion 52.

As described above, a mechanical force may be externally applied to switch beam 36 by additional beam 44 prior to reducing an attractive force between the switch beam and closing gate 40. In another embodiment, deflecting switch beam 36 from contact structure 42 may include increasing the actuation voltage applied to opening gate 48 after the release of the closing voltage from closing gate 40. In an alternative embodiment, the mechanical force may be externally applied to switch beam 36 by additional beam 44 after reduction of an attractive force between the switch beam and closing gate 40. In another embodiment, the mechanical force may be externally applied to switch beam 36 by additional beam 44 substantially simultaneously with reduction of an attractive force between the switch beam and closing gate 40. In additional embodiments, the mechanical force may be applied to switch beam 36 by additional beam 44 before, after, or during actuation of return gate 43.

As further shown in FIG. 13, additional beam 44 may remain in contact with substrate 34 by application of a voltage to opening gate 48 until switch beam 36 has moved away from contact structure. In addition, additional fulcrum 46 may not remain in contact with substrate 34 after switch beam 36 has moved away from contact structure 42, as shown in FIG. 13. However, depending upon the attractive force between additional beam 44 and opening gate 48, the stiffness of the additional beam, the stiffness of the switch beam, and the lengths of the additional beam from the fixed and free ends to the additional fulcrum, the additional fulcrum may or may not remain in contact with substrate 34 after switch beam 36 has moved away from contact structure 42. After opening of the switch, the opening gate may be released, and additional beam 44 may return to its position before closing of the switch, as shown in FIG. 6.

It will be appreciated to those skilled in the art having the benefit of this disclosure that this invention is believed to provide a microelectromechanical device including a switch configured for active opening by application of a mechanical force. Further modifications and alternative embodiments of various aspects of the invention will be apparent to those skilled in the art in view of this description. For example, different configurations of switches may be incorporated with the aspects of the device described herein. In addition, the switch beams and the additional beams may include one or more openings to allow air to flow through the switch beams and the additional beams during actuation of the switch beams and the additional beams. In particular, the beam may have various shapes such as extensions or gaps within its structure. It is intended that the following claims be interpreted to embrace all such modifications and changes and, accordingly, the drawings and the specification are to be regarded in an illustrative rather than a restrictive sense.

What is claimed is:

1. A microelectromechanical device, comprising a beam configured to apply an opening force on a closed switch, wherein the opening force is substantially independent of a force stored in the closed switch.

2. The device of claim 1, wherein the opening force is a mechanical force.

3. The device of claim 1, wherein the beam is further configured to apply the opening force on the closed switch upon actuation of the beam by an electrostatic force.

4. The device of claim 1, wherein a combination of the opening force and the force stored in the closed switch is sufficient to open the switch after removal of a force associated with actuation of the switch.

5. The device of claim 1, wherein a combination of the opening force and the force stored in the closed switch is sufficient to overcome a sticking force tending to keep the switch closed after removal of a force associated with actuation of the switch.

6. A microelectromechanical device, comprising:
a switch beam spaced above a closing gate and a contact structure; and
an additional beam configured to apply a force on the switch beam in a direction away from the contact structure.

7. The device of claim 6, wherein actuation of the closing gate brings a portion of the switch beam into contact with the contact structure.

8. The device of claim 6, wherein the additional beam is further configured to apply the force on the switch beam upon actuation of an opening gate proximate to an end of the additional beam spaced from the contact structure.

9. The device of claim 6, wherein the switch beam comprises a cantilever beam.

10. The device of claim 6, wherein the force is independent of an inherent opening force of the switch beam due to deformation.

11. The device of claim 6, wherein a combination of the force and a force stored in the switch beam is sufficient to move the switch beam away from the contact structure upon reduction of an attractive force between the switch beam and the closing gate.

12. The device of claim 6, wherein the switch beam comprises a teeter-totter beam.

13. The device of claim 12, wherein a combination of the force and a force stored in pivot springs of the switch beam is sufficient to move the switch beam away from the contact structure upon reduction of an attractive force between the switch beam and the closing gate.

14. The device of claim 6, further comprising at least one other additional beam configured to apply an additional force on the switch beam in the direction away from the contact structure.

15. The device of claim 6, wherein the additional beam extends from the switch beam away from the contact structure and toward an opening gate.

16. The device of claim 6, wherein the additional beam extends from the switch beam away from the contact structure and in a direction approximately parallel so a length of the switch beam.

17. The device of claim 6, wherein the additional beam extends from the switch beam away from the contact structure and in a direction substantially perpendicular to a length of the switch beam.

18. The device claim 6, wherein the additional beam extends from the switch beam away from the contact structure, and wherein the additional beam is collinear with the switch beam.

19. The device of claim 6, wherein the additional beam has a first end proximate the contact structure, a second end proximate an opening gate, and an additional fulcrum disposed between the first and second ends.

20. The device or claim 6, wherein the switch beam comprises a main fulcrum spaced from the contact structure, wherein the additional beam comprises an additional fulcrum, and wherein the main fulcrum has a lower surface that is not coplanar with a lower surface of the additional fulcrum.

21. The device of claim 6, wherein the switch beam comprises a main fulcrum spaced from the contact structure, wherein the additional beam comprises an additional fulcrum, and wherein the main fulcrum has a height that is greater than a height of the additional fulcrum.

22. The device of claim 6, wherein actuation of the closing gate brings a portion of the additional beam toward the contact structure.

23. The device of claim 6, wherein actuation of the closing gate brings a portion of the additional beam toward the contact structure and increases a force with which the switch beam contacts the contact structure.

24. The device of claim 6, wherein actuation of the closing gate brings an additional fulcrum of the additional beam in contact with an upper surface of a substrate upon which the closing gate and the contact structure are formed.

25. The device of claim 6, wherein actuation of the closing gate brings the additional beam toward an opening gate spaced below the additional beam.

26. The device of claim 6, wherein the additional beam is configured to bend upon actuation of an opening gate spaced below the additional beam such that a portion of the additional beam spaced from the switch beam contacts a structure upon which the opening gate is formed.

27. The device of claim 6, wherein the additional beam comprises a dimpled portion proximate an opening gate spaced below the additional beam such that the additional beam does not contact the opening gate upon actuation of the opening gate.

28. The device of claim 6, wherein a thickness of the additional beam is different than a thickness of the switch beam.

29. The device of claim 6, wherein the device is configured as a multi-pole switch, the device further comprising an additional contact structure spaced below the additional beam end arranged such that the additional beam contacts the additional contact structure upon actuation of an opening gate proximate to an end of the additional beam spaced from the contact structure.

30. The device of claim 6, wherein actuation of the closing gate brings a portion of the switch beam into contact with the contact structure, the device further comprising an opening gate spaced below the additional beam and proximate to an end of the additional beam spaced from the contact structure, wherein actuation of the opening gate reduces a contact force with which the switch beam contacts the contact structure while the switch beam is in contact with the contact structure.

31. A method for opening a switch, comprising:
  reducing an attractive force between a switch beam and a closing gate; and
  externally applying a mechanical force on the switch beam in a direction away from the closing gate.

32. The method of claim 31, wherein said reducing and said applying are performed substantially simultaneously.

33. The method of claim 31, wherein said reducing is performed before said applying.

34. The method of claim 31, wherein said reducing is performed after said applying.

* * * * *

UNITED STATES PATENT AND TRADEMARK OFFICE
CERTIFICATE OF CORRECTION

| | |
|---|---|
| PATENT NO. | : 7,053,736 B2 |
| APPLICATION NO. | : 10/260598 |
| DATED | : May 30, 2006 |
| INVENTOR(S) | : Nelson |

It is certified that error appears in the above-identified patent and that said Letters Patent is hereby corrected as shown below:

<u>On the Cover Page</u>

(74) *Attorney, Agent, or Firm*: Please delete "Kevin J. Daffer" and substitute --Kevin L. Daffer--.
Please delete "Mollie F. Lettang" and substitute therefor --Mollie E. Lettang--.

<u>In the Claims</u>

Col. 25, line 34: Please delete "so" and substitute therefor --to--.

<u>Col. 26</u>
at line 19: Please delete "structure" and substitute therefore --substrate--.
at line 32: Please delete "end" and substitute therefor --and--.

Signed and Sealed this

Second Day of January, 2007

JON W. DUDAS
*Director of the United States Patent and Trademark Office*